(12) United States Patent
Tanaka

(10) Patent No.: US 7,852,655 B2
(45) Date of Patent: Dec. 14, 2010

(54) SEMICONDUCTOR MEMORY DEVICE

(75) Inventor: Takuji Tanaka, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 482 days.

(21) Appl. No.: 11/836,359

(22) Filed: Aug. 9, 2007

(65) Prior Publication Data
US 2008/0037311 A1 Feb. 14, 2008

(30) Foreign Application Priority Data
Aug. 9, 2006 (JP) .............................. 2006-216578

(51) Int. Cl.
*G11C 5/06* (2006.01)
(52) U.S. Cl. ...................................... 365/72; 356/154
(58) Field of Classification Search .................. 365/63, 365/72, 154, 156, 188; 257/368, 393
See application file for complete search history.

(56) References Cited

U.S. PATENT DOCUMENTS

| 5,526,303 | A | 6/1996 | Okajima |
| 5,909,047 | A | 6/1999 | Takahashi |
| 6,072,714 | A | 6/2000 | Deguchi |
| 2002/0024856 | A1 | 2/2002 | Kumagai et al. |

| 2004/0212018 | A1 * | 10/2004 | Shino .......................... 257/368 |

FOREIGN PATENT DOCUMENTS

| EP | 1598805 A2 | 11/2005 |
| JP | 06169071 A | 6/1994 |
| JP | 08097298 A | 4/1996 |
| JP | 10335487 A | 12/1998 |
| KR | 2003-0034469 A1 | 5/2003 |

OTHER PUBLICATIONS

European Search Report dated Aug. 6, 2009, issued in corresponding European Patent Application No. 07113383.9.

* cited by examiner

*Primary Examiner*—Anh Phung
*Assistant Examiner*—Harry W Byrne
(74) *Attorney, Agent, or Firm*—Fujitsu Patent Center

(57) ABSTRACT

Disclosed is a semiconductor memory device capable of realizing reduction in an SRAM unit cell area. Using as a standard configuration a parallel-type SRAM unit cell having each pair of load transistors, driver transistors and transfer transistors, all or a part of the gate electrodes and active regions configuring at least any one of the pairs of the transistors, for example, the pair of the transfer transistors are configured obliquely in a predetermined direction from the standard configuration. As a result, a size in a cell outside part including the driver transistor and the transfer transistor is reduced. At the same time, a distance between the load transistors in the central part is reduced as compared with that in the standard configuration. Thus, area reduction in the whole SRAM unit cell is realized.

5 Claims, 15 Drawing Sheets

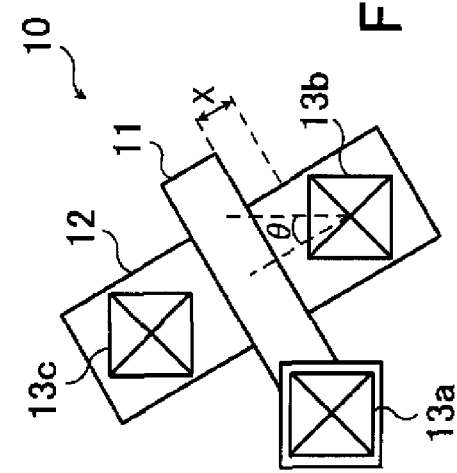
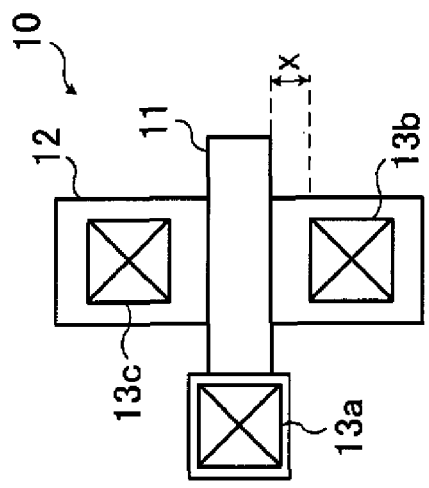
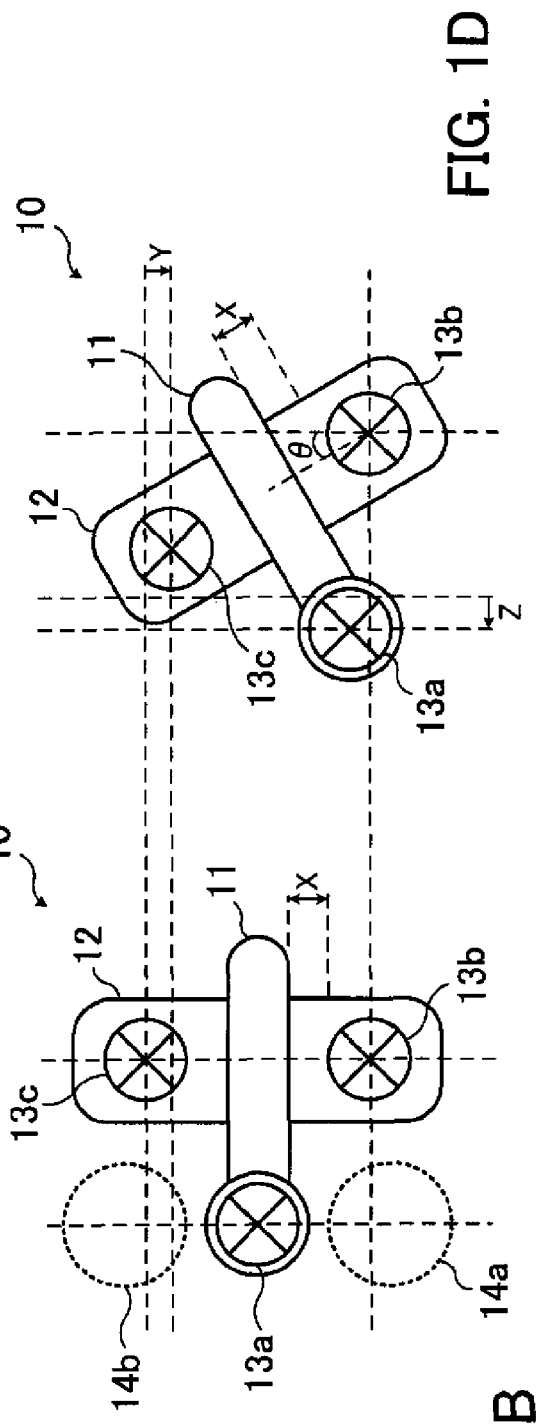

SEMICONDUCTOR MEMORY DEVICE

CROSS-REFERENCE TO RELATED APPLICATIONS

This application is based upon and claims the benefits of priority from the prior Japanese Patent Application No. 2006-216578, filed on Aug. 9, 2006, the entire contents of which are incorporated herein by reference.

BACKGROUND OF THE INVENTION

1. Field of the Invention

The present invention relates to a semiconductor memory device. More particularly, the present invention relates to a static-type semiconductor memory device.

2. Description of the Related Art

A Static Random Access Memory (SRAM) as one type of volatile memory requires no refresh operation and has a high operation speed. Therefore, the SRAM is currently used in various devices. In recent years, higher speed up, miniaturization of unit cells and improvement in a degree of integration have progressed. Therefore, applications of the SRAM have more spread.

Herein, one example of conventional SRAM unit cells will be described with reference to FIGS. 12 to 15. FIGS. 12 to 15 illustrate by an example an SRAM unit cell including a bulk layer having formed thereon a transistor and including first to third wiring layers sequentially formed on the bulk layer.

FIG. 12 is an essential-part schematic plan view between a bulk layer and a first wiring layer of a conventional SRAM unit cell. FIG. 13 is an essential-part schematic plan view between a bulk layer and a second wiring layer of a conventional SRAM unit cell. FIG. 14 is an essential-part schematic plan view between a bulk layer and a third wiring layer of a conventional SRAM unit cell. FIG. 15 is an equivalent circuit diagram of an SRAM unit cell.

An SRAM unit cell 100 comprises a total of six transistors composed of load transistors L1 and L2, driver transistors D1 and D2, and transfer transistors T1 and T2.

These six transistors have the following configuration. For example, as shown in FIG. 12, a gate electrode 101 of the load transistor L1 and the driver transistor D1, a gate electrode 102 of the load transistor L2 and the driver transistor D2, and gate electrodes 103 and 104 of the transfer transistors T1 and T2 each have a linear shape in the major axis direction and are configured parallel to each other. Well region boundaries 151 and 152 have boundaries for injecting different conductivity-type impurities. In the left and right regions of these boundaries, P type well/N type transistors and N type well/P type transistors are configured in the well regions 153 and 155 and in the well region 154, respectively.

Active regions 105, 106, 107 and 108 are extended in the direction perpendicular to the major axis direction of the gate electrodes 101, 102, 103 and 104, respectively. The active regions 105 and 106 are configured to intersect the gate electrodes 101 and 102, respectively. The active region 107 is configured to intersect the gate electrodes 101 and 103. The active region 108 is configured to intersect the gate electrodes 102 and 104.

On ends of the respective gate electrodes 101, 102, 103 and 104 as well as within the active regions 105, 106, 107 and 108 (a source/drain of each transistor) on both sides of the respective gate electrodes 101, 102, 103 and 104, contact electrodes connected to each of the gate electrodes and active regions are configured. On the gate electrode 101 of the load transistor L1 as well as within the active region 106 of the load transistor L2, for example, the contact electrodes using a shared contact technology are configured. Similarly, on the gate electrode 102 of the load transistor L2 as well as within the active region 105 of the load transistor L1, for example, the contact electrodes using a shared contact technology are configured.

Each of the gate electrodes 101, 102, 103 and 104 and active regions 105, 106, 107 and 108 of the respective transistors is connected to a first wiring M1 (chain line in the drawing) through the contact electrode.

Each of the respective first wirings M1 is further connected to a second wiring M2 (dotted line in the drawing) through the contact electrode, as shown in FIG. 13. Among these, the second wiring M2 for connecting between the first wirings M1 connected to the gate electrodes 103 and 104 of the transfer transistors T1 and T2 serves as a word line WL of the SRAM.

Each of the respective second wirings M2 is further connected to a third wiring M3 (dashed line in the drawing) through the contact electrode, as shown in FIG. 14. Through the third wiring, the load transistors L1 and L2 are connected to a power supply line Vcc, the driver transistors D1 and D2 are connected to a grounding line Vss and the transfer transistors T1 and T2 are connected to the bit lines BL1 and BL2, respectively.

As a result, a circuit as shown in FIG. 15 is realized.

Thus, the conventional SRAM unit cell generally has the following configuration. That is, the gate electrodes each have a linear shape and are configured parallel to each other. Further, the active regions are each extended linearly in the direction perpendicular to the gate electrodes and are configured parallel to each other. The SRAM unit cell using such a configuration is called as a "parallel-type unit cell" and has a merit that design and manufacture (process) are easy. In addition to the above merit, the unit cell further has a merit that by configuring the respective transistors in an orderly manner, reduction in a unit cell area and improvement in a degree of integration can be realized.

In the SRAM, further miniaturization of the unit cell is now desired strongly with spreading of its application and a demand for its large capacity.

In order to realize miniaturization of the SRAM, a SRAM unit cell having various configurations is recently proposed. For example, there is proposed the following SRAM unit cell. Gate electrodes and active regions are configured parallel to each other, respectively. Further, the gate electrodes and the active regions are configured obliquely to a word line and to bit line perpendicular thereto. Thus, the area reduction in the SRAM unit cell is realized (see, e.g., Japanese Unexamined Patent Application Publication No. Hei 10-335487). Further, there is proposed the following SRAM unit cell. Gate electrodes and active regions are configured obliquely between two parallel strip-shaped branch word lines (see, e.g., Japanese Unexamined Patent Application Publication No. Hei 6-169071). Further, there is proposed the following SRAM unit cell. A power supply line and a grounding line are configured parallel to each other as well as a word line is configured parallel to the power supply line and the grounding line. Then, each transistor is configured. Thus, a width in the word line direction is reduced (see, e.g., Japanese Unexamined Patent Application Publication No. Hei 8-97298).

In the case of a parallel-type SRAM unit cell heretofore widely used, area reduction thereof can be realized by using the following configuration. For example, gate electrodes and active regions are configured parallel to each other, respectively. At the same time, a distance therebetween is reduced within a technically-feasible range.

However, the following problems now occur upon a further miniaturization request of an SRAM unit cell. That is, it becomes difficult to reduce the unit cell area while securing a distance margin between a gate electrode of each transistor and a contact electrode connected to an active region of each transistor.

Further, it becomes difficult to secure the distance margin between constituents of different transistors only by simply reducing a distance between gate electrodes or between active regions. For example, in the above-described parallel-type SRAM unit cell, it becomes difficult to secure the distance margin between a gate electrode end of a transfer transistor and a shared contact electrode of a load transistor.

SUMMARY OF THE INVENTION

Therefore, one possible object is to provide a semiconductor memory device having a high-reliable and small unit cell.

In particular, an example embodiment of the improved semiconductor memory device includes a unit cell including first and second load transistors configured in a central part and including a first driver transistor and a first transfer transistor as well as a second driver transistor and a second transfer transistor configured on each side of the central part, wherein: using as a standard configuration a cell configuration in which a first gate electrode of the first load transistor and the first driver transistor, a second gate electrode of the second load transistor and the second driver transistor, a third gate electrode of the first transfer transistor, the third gate electrode being configured in a major axis direction of the second gate electrode, and a fourth gate electrode of the second transfer transistor, the fourth gate electrode being configured in a major axis direction of the first gate electrode, each have a linear shape and are configured parallel to each other, and first and second active regions each having formed therein the first and second gate electrodes, a third active region having formed therein the first and third gate electrodes, and a fourth active region having formed therein the second and fourth gate electrodes are each extended linearly in the direction perpendicular to the major axis direction of the first to fourth gate electrodes and are configured parallel to each other, gate electrodes and active regions of at least any one of the pairs of transistors selected from a pair of the first and second load transistors, a pair of the first and second driver transistors, and a pair of the first and second transfer transistors are configured obliquely from the standard configuration.

The above and other objects, features and advantages of the present invention will become apparent from the following description when taken in conjunction with the accompanying drawings which illustrate preferred embodiments of the present invention by way of example.

BRIEF DESCRIPTION OF THE DRAWINGS

FIGS. 1A, 1B, 1C and 1D are explanatory drawings of a basic functional configuration. FIG. 1A is an essential-part schematic plan view of a normally designed transistor. FIG. 1D is an essential-part schematic plan view of a transistor obtained by the manufacturing based on the design of FIG. 1A. FIG. 1C is an essential-part schematic plan view of an obliquely configured and designed transistor. FIG. 1D is an essential-part schematic plan view of a transistor obtained by the manufacturing based on the design of FIG. 1C.

DESCRIPTION OF THE PREFERRED EMBODIMENTS

Figure 2:
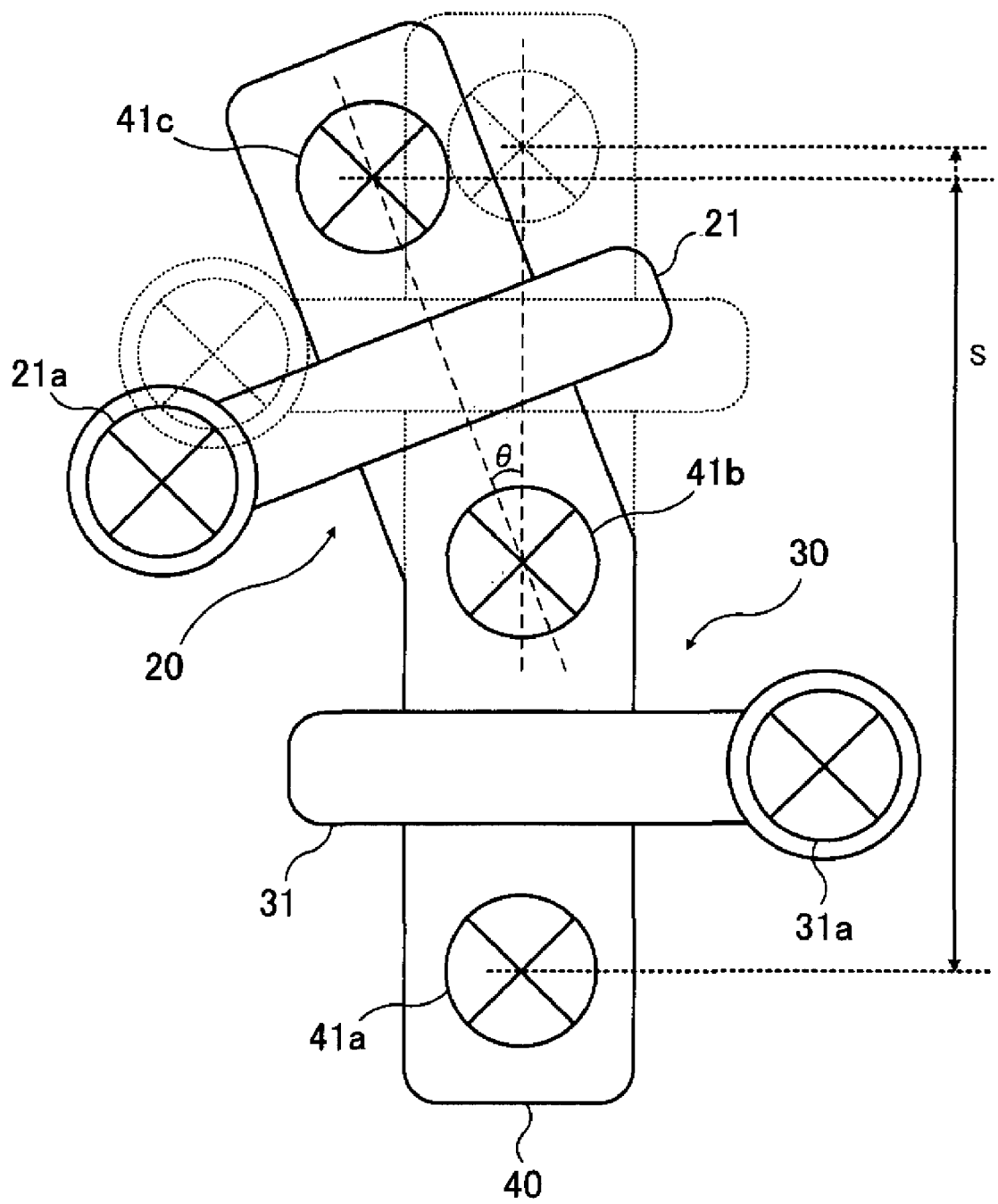
FIG. 2 is an explanatory drawing of a size reduction effect in adjacent transistors (part 1).

Preferred embodiments of the present invention will be described in detail below with reference to the accompanying drawings, wherein like reference numerals refer to like elements throughout.

FIGS. 1A, 1B, 1C and 1D are explanatory drawings of a basic functional configuration. FIG. 1A is an essential-part schematic plan view of a normally designed transistor. FIG. 1B is an essential-part schematic plan view of a transistor obtained by the manufacturing based on the design of FIG. 1A. FIG. 1C is an essential-part schematic plan view of an obliquely configured and designed transistor. FIG. 1D is an essential-part schematic plan view of a transistor obtained by the manufacturing based on the design of FIG. 1C.

As shown in FIG. 1A, a transistor 10 has the following configuration. A gate electrode 11 linearly extending in the horizontal direction in the drawing is configured, and active region 12 extending in the direction (gate length direction) perpendicular to a major axis direction of the electrode 11 is configured to intersect the electrode 11. Further, on an end of the gate electrode 11 as well as within the active regions 12 on both sides of the electrode 11, contact electrodes 13a, 13b and 13c connected to each of the electrode 11 and regions 12 are configured.

In designing such a transistor 10, the configuration of the respective contact electrodes 13b and 13c is determined such that a constant distance (e.g., a distance in a minimum design rule) X is secured between the gate electrode 11 and each of the contact electrodes 13b and 13c on both sides of the gate electrode 11.

This is because when the constant distance X is not secured, the following problem occurs. In actually performing manufacturing based on the design, when displacement occurs in a formed position of the gate electrode 11 or in a formed position of a contact hole, a short circuit may occur between the gate electrode 11 and each of the contact electrodes 13b and 13c (active regions 12). Accordingly, in order to avoid occurrence of the short circuit even if such displacement occurs, the contact electrodes 13b and 13c are configured while securing the constant distance X with the gate electrode 11.

When actually performing manufacturing based on such a design, any of the gate electrode 11, the active region 12 and the contact electrodes 13a, 13b and 13c which are configured (drawn) in a rectangle shape in terms of design are formed to have rounded corners as shown in FIG. 1B. Particularly, the contact electrodes 13a, 13b and 13c have a circular shape depending on sizes thereof.

On the other hand, the transistor 10 shown in FIG. 1C is a transistor obtained by obliquely designing the transistor 10 shown in FIG. 1A (by designing the transistor 10 obliquely only by an angle of θ). The transistor 10 has the following configuration. The gate electrode 11 linearly extending is obliquely configured, and the active region 12 is configured in the direction perpendicular to the major axis direction of the gate electrode 11. Further, on an end of the gate electrode 11 as well as within the active region 12, the contact electrodes 13a, 13b and 13c connected to each of the electrode 11 and regions 12 are configured.

In the case of obliquely configuring and designing the transistor 10, the rectangular contact electrodes 13a, 13b and 13c are configured (drawn) without being designed obliquely for convenience of design. Therefore, in a stage of design, the gate electrode 11 and each of the contact electrodes 13b and 13c have a configuration relationship in which a distance therebetween is shorter than the distance X shown in FIGS. 1A and 1B.

When actually performing manufacturing based on the design of FIG. 1C, the gate electrode 11, active region 12, and contact electrodes 13a, 13b and 13c each having rounded corners are formed as shown in FIG. 1D. At this time, each of the contact electrodes 13a, 13b and 13c is formed to a round shape. Therefore, between the gate electrode 11 and each of the contact electrodes 13b and 13c having a configuration relationship in which a distance therebetween is shorter than the distance X in a stage of design, a constant distance X is secured after actual formation.

Herein, configurations of the transistors 10 shown in FIGS. 1B and 1D are compared.

Comparing FIGS. 1B and 1D, the transistor 10 in FIG. 1D has a configuration in which the transistor 10 in FIG. 1B is configured obliquely by an angle θ. However, when the transistor 10 is manufactured to have a configuration as shown in FIG. 1B, spaces such as regions 14a and 14b exist in terms of the layout. When the transistor 10 is configured obliquely from a state of FIG. 1B to that of FIG. 1D, such regions 14a and 14b can be efficiently used in terms of the layout.

Specifically, when the transistor 10 is configured obliquely from a state of FIG. 1B to that of FIG. 1D on the basis of a center position of the contact electrode 13b, a part of the gate electrode 11 and of the active region 12 can be configured using the regions 14a and 14b. At this time, the center position of the contact electrode 13c is shifted by a distance Y in the downward direction in the drawing. As a result, size reduction in the vertical direction in the drawing can be realized without reducing the distance X between the gate electrode 11 and each of the contact electrodes 13b and 13c.

When the transistor 10 is thus configured obliquely, the center position of the contact electrode 13a connected to the gate electrode 11 is shifted by a distance Z in the left direction in the drawing.

The size reduction effect in the vertical direction in the drawing as shown in FIG. 1 becomes more remarkable when plural transistors are adjacent to each other.

When the transistor 10 is included in a specific unit cell, for example, in a unit cell which is long in the horizontal direction in the drawing and is short in the vertical direction in the drawing, the following effect is provided. When making a comparison in terms of areas, even if the size in the horizontal direction in the drawing increases, the size reduction effect in the vertical direction in the drawing is apt to be larger than the size increase effect in the horizontal direction in the drawing.

Figure 3:
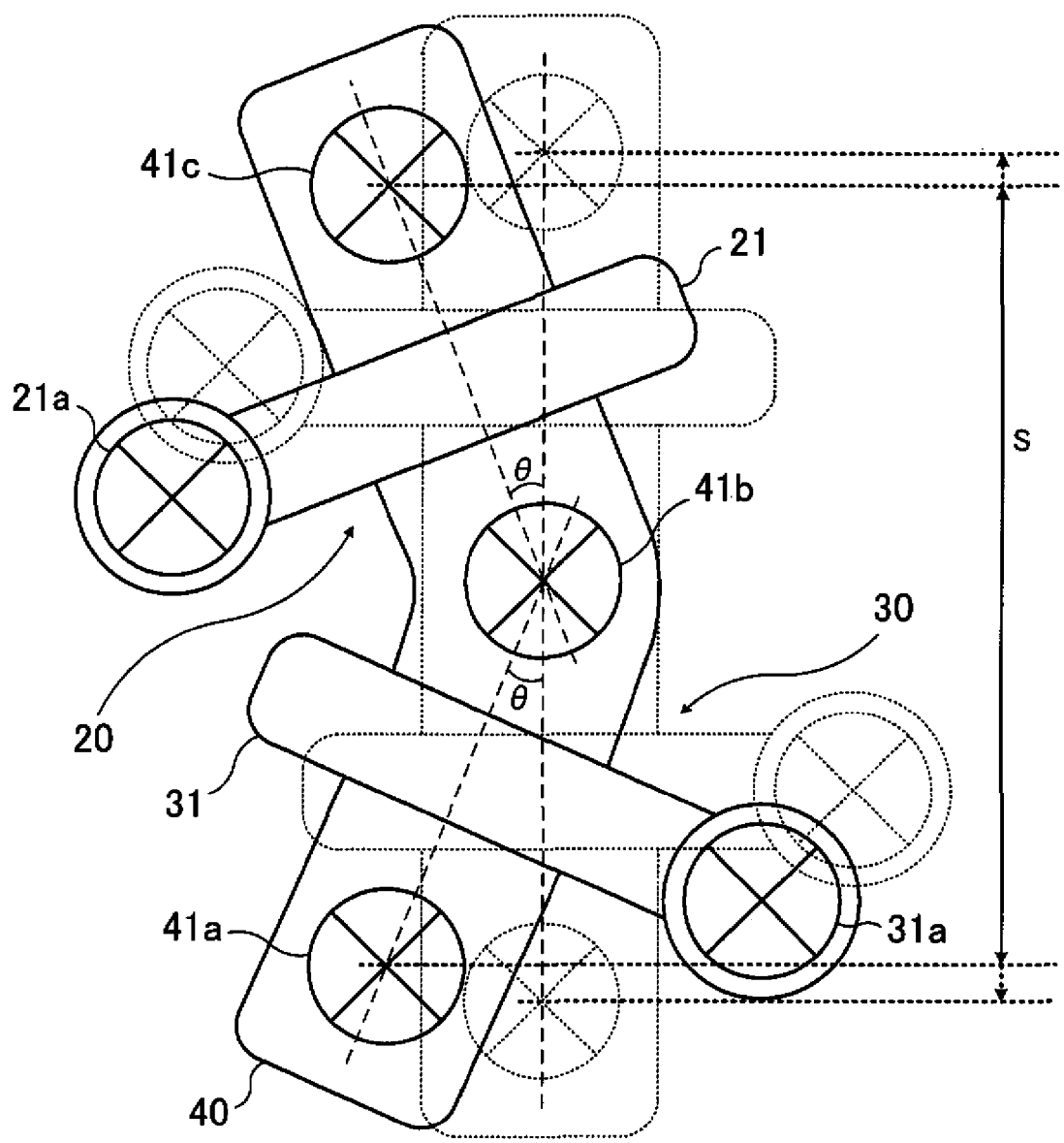
FIG. 3 is an explanatory drawing of a size reduction effect in adjacent transistors (part 2).

FIGS. 2 and 3 are explanatory drawings of the size reduction effect in adjacent transistors.

For example, assume that two transistors 20 and 30 are configured adjacent to each other as shown in FIGS. 2 and 3. Herein, the transistors 20 and 30 have the following configuration. Each of linear gate electrodes 21 and 31 is formed to intersect an active region 40. On ends of the gate electrodes 21 and 31, contact electrodes 21a and 31a are formed, respectively. Within the active region 40, contact electrodes 41a, 41b and 41c are formed.

FIG. 2 shows a configuration in which one transistor 20 of the adjacent transistors 20 and 30 is configured obliquely by an angle θ from the standard configuration (This configuration means a configuration in which the transistor 20 is not configured obliquely. In FIG. 2, this configuration is shown by a dotted line.). At this time, the gate electrodes 21 and 31 have a non-parallel configuration relationship. Further, the active region 40 has not a linear shape but a curved shape in the region between the gate electrodes 21 and 31. By adopting such a configuration, the position of the contact electrode 41c can be shifted in the downward direction in the drawing while keeping a distance between the contact electrode 41c and the gate electrode 21. Accordingly, a size S between the adjacent transistors 20 and 30 in the vertical direction in the drawing can be reduced as compared with that in the standard configuration.

FIG. 3 shows a configuration in which both of the adjacent transistors 20 and 30 are configured obliquely by an angle θ in the direction opposite each other away from the standard configuration (This configuration means a configuration in which the transistors 20 and 30 are not configured obliquely. In FIG. 3, this configuration is shown by a dotted line.). At this time, the gate electrodes 21 and 31 have a non-parallel configuration relationship. Further, the active region 40 in the region between the gate electrodes 21 and 31 has a more curved shape than that of FIG. 2. By adopting such a configuration, the position of the contact electrode 41c can be shifted in the downward direction in the drawing while keeping a distance between the contact electrode 41c and the gate electrode 21. At the same time, the position of the contact electrode 41a can be shifted in the upward direction in the drawing while keeping a distance between the contact electrode 41a and the gate electrode 31. Accordingly, a size S between the adjacent transistors 20 and 30 in the vertical direction in the drawing can be more reduced as compared with that in the standard configuration.

As described above, by adopting a configuration in which the transistor is configured obliquely by a constant angle θ from the standard configuration, size reduction in a predetermined direction can be realized while securing a distance margin between the gate electrode and the contact electrode.

Herein, the angle θ is set in the range of $0° < θ \leq 45°$. When the angle θ is more than 45°, the following disadvantages occur. That is, there is an increasing possibility that interference among constituents occurs in terms of the layout. Further, the need to largely change the layout of wirings formed on an upper layer may arise. When the angle θ is set in the relatively small range of 45° or less, the following advantages are provided. That is, the interference among constituents or the problem in layout change can be avoided. Therefore, no significant difficulty is encountered in obliquely configuring and designing a transistor. Further, no significant difficulty is encountered also in manufacturing a transistor based on the design.

In the above description, there is described a case where the whole one transistor, more specifically, both of the gate electrode and active region constituting the transistor are configured obliquely by a constant angle θ. In addition, the following case is possible. In one transistor, only the active region or only the gate electrode is obliquely configured in consideration of a distance margin between the gate electrode and the contact electrode.

In the case where only the active region is obliquely configured in consideration of a distance margin between the gate electrode and the contact electrode, size reduction in the direction perpendicular to the major axis direction of the gate electrode can be realized according to the above example.

In the case where only the gate electrode is obliquely configured in consideration of a distance margin between the gate electrode and the contact electrode, size reduction can be realized depending on the configuration of the transistor. Further, other transistor constituents can also be configured on an empty space formed by obliquely configuring the gate electrode. This point will be described later.

Further, the following case is also possible. In one transistor, only a part of the gate electrode (e.g., a protruded part from the active region) is obliquely configured without changing a configuration of an essential-part of the gate electrode as well as a configuration of the active region. Also in this case, other transistor constituents can be configured on an empty space formed by obliquely configuring a part of the gate electrode. This point will be described later.

A case of applying the above-described principle to an SRAM will be described in detail below.

A first application example will be first described.

Figure 4:
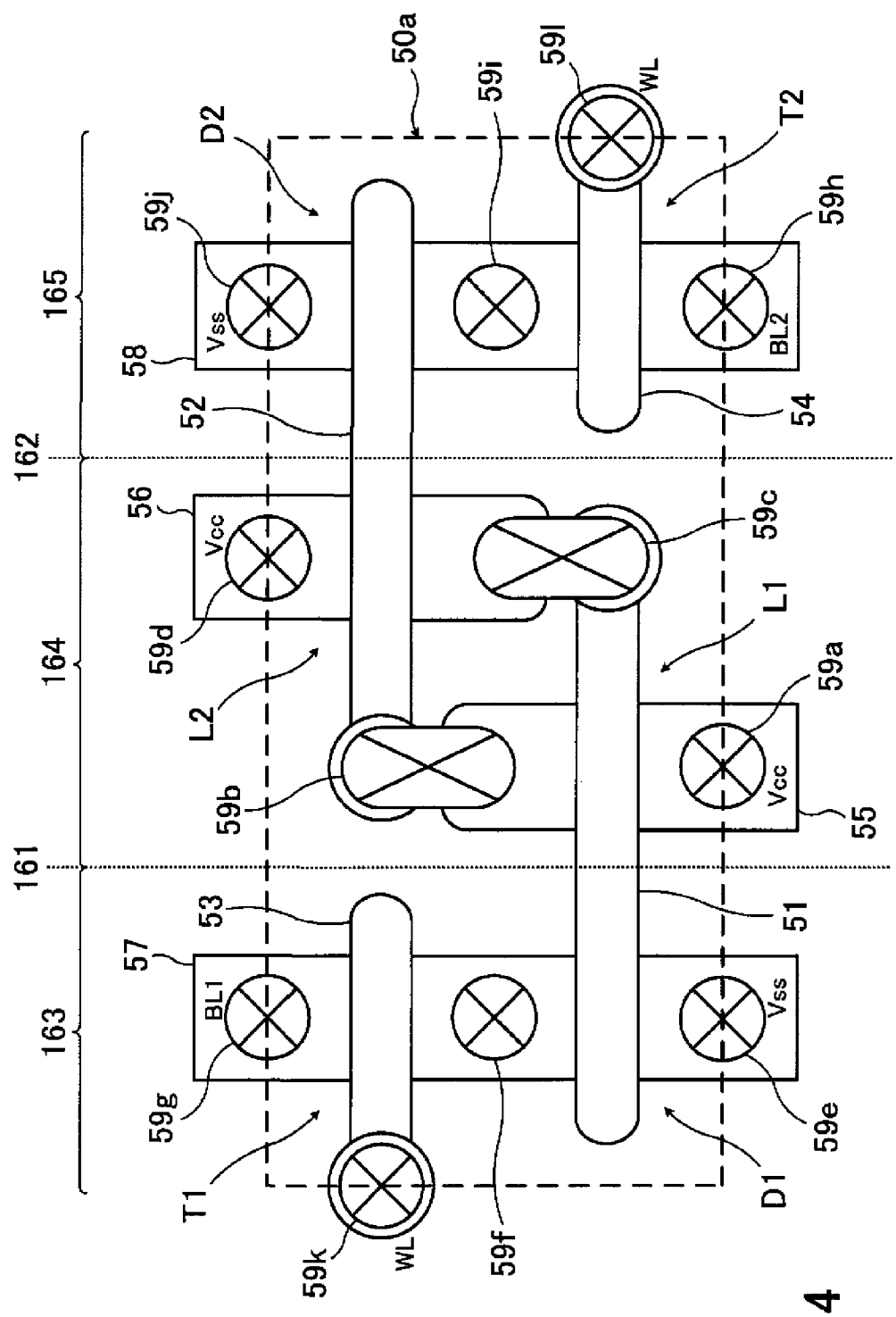
FIG. 4 is an essential-part schematic plan view of a standard parallel-type SRAM unit cell.
Figure 5:
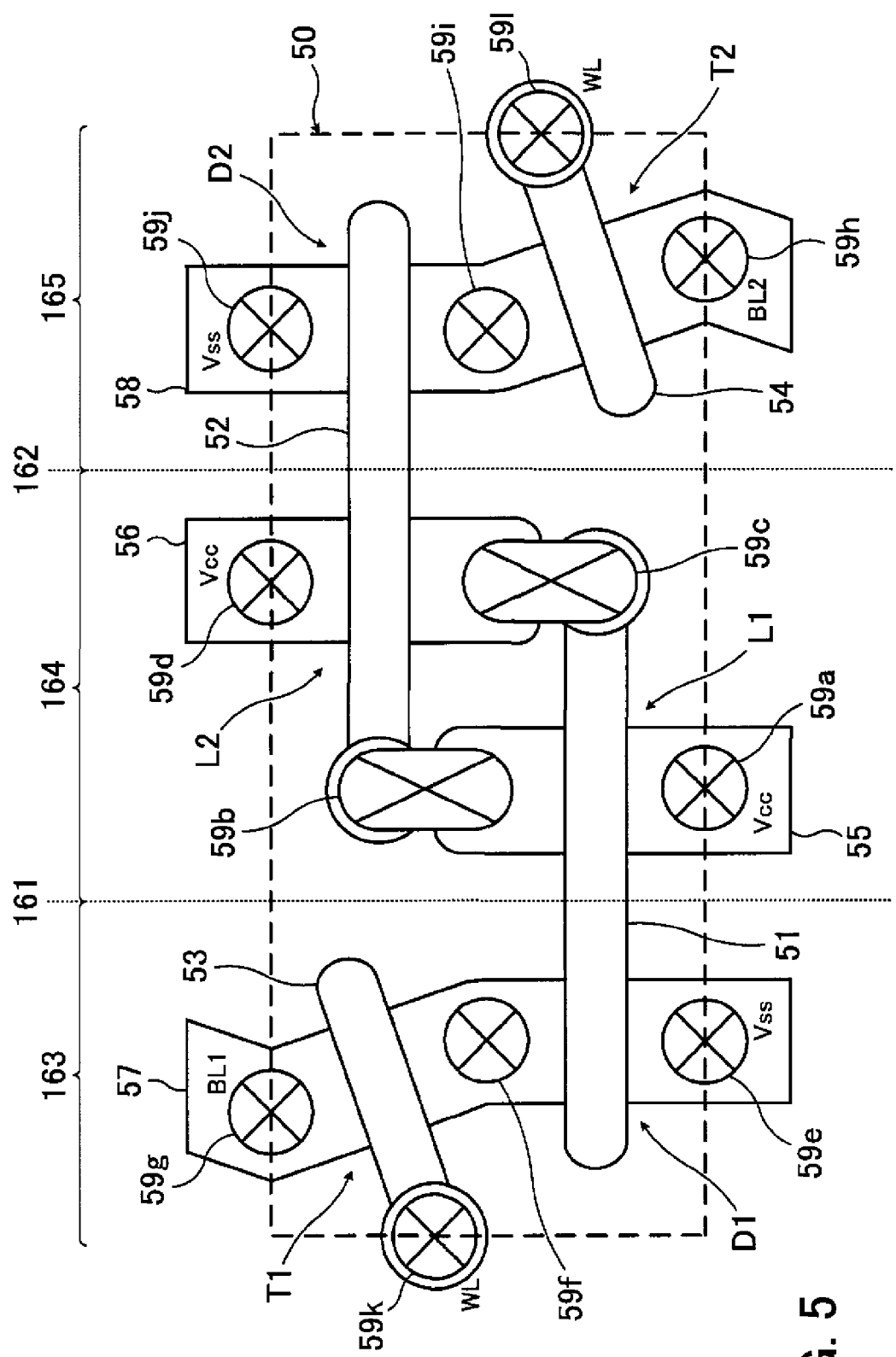
FIG. 5 is an essential-part schematic plan view of an SRAM unit cell of a first application example.

FIG. 4 is an essential-part schematic plan view of a standard parallel-type SRAM unit cell. FIG. 5 is an essential-part schematic plan view of an SRAM unit cell of the first application example.

First, a standard cell configuration (standard configuration) will be described with reference to FIG. 4.

As shown in FIG. 4, a standard SRAM unit cell 50a comprises a total of six transistors composed of load transistors L1 and L2 configured in the central part, driver transistors D1 and D2 and transfer transistors T1 and T2 configured outside of the central part. Well region boundaries 161 and 162 have boundaries for injecting different conductivity-type impurities. In the left and right regions of these boundaries, different conductivity-type transistors are configured. The driver transistors D1 and D2 and transfer transistors T1 and T2 in the well regions 163 and 165 are configured as an N-type transistor. The load transistors L1 and L2 in the well region 164 are configured as a P-type transistor.

These six transistors have the following configuration. A gate electrode 51 of the load transistor L1 and the driver transistor D1, a gate electrode 52 of the load transistor L2 and the driver transistor D2, and gate electrodes 53 and 54 of the transfer transistors T1 and T2 each have a linear shape in the major axis direction and are configured parallel to each other.

Active regions 55, 56, 57 and 58 are extended in the direction perpendicular to the major axis direction of the gate electrodes 51, 52, 53 and 54, respectively. The active region 55 is configured to intersect the gate electrode 51. The active region 56 is configured to intersect the gate electrode 52. The active region 57 is configured to intersect the gate electrodes 51 and 53. The active region 58 is configured to intersect the gate electrodes 52 and 54.

On ends of the respective gate electrodes 51, 52, 53 and 54 as well as within the active regions 55, 56, 57 and 58 on both sides of the respective gate electrodes 51, 52, 53 and 54, contact electrodes 59a to 59l connected to each of the gate electrodes and active regions are configured.

Both of the contact electrodes 59a and 59d of the load transistors L1 and L2 are connected to a power supply line Vcc in the upper layer. That is, sources of the load transistors L1 and L2 are connected to the power supply line Vcc.

Both of the contact electrodes 59e and 59j of the driver transistors D1 and D2 are connected to a grounding line Vss in the upper layer. That is, sources of the driver transistors D1 and D2 are connected to the grounding line Vss.

The contact electrode 59g of the transfer transistor T1 is connected to a first bit line BL1 in the upper layer, and the contact electrode 59h of the transfer transistor T2 is connected to a second bit line BL2 in the upper layer. That is, a source of the transfer transistor T1 is connected to the first bit line BL1, and a source of the transfer transistor T2 is connected to the second bit line BL2.

The contact electrodes 59k and 59l connected to the gate electrodes 53 and 54 of the transfer transistors T1 and T2 are connected to a common word line WL in the upper layer.

A shared contact technology is applied to the contact electrodes 59b and 59c connected to the gate electrodes 52 and 51. The contact electrode 59b is connected to the contact electrode 59f in the upper layer, and the contact electrode 59c is connected to the contact electrode 59i in the upper layer. In other words, the gate electrode 52 of the load transistor L2 and the driver transistor D2 is connected to each drain of the load transistor L1, the driver transistor D1 and the transfer transistor T1. Further, the gate electrode 51 of the load transistor L1 and the driver transistor D1 is connected to each drain of the load transistor L2, the driver transistor D2 and the transfer transistor T2.

Figure 15:
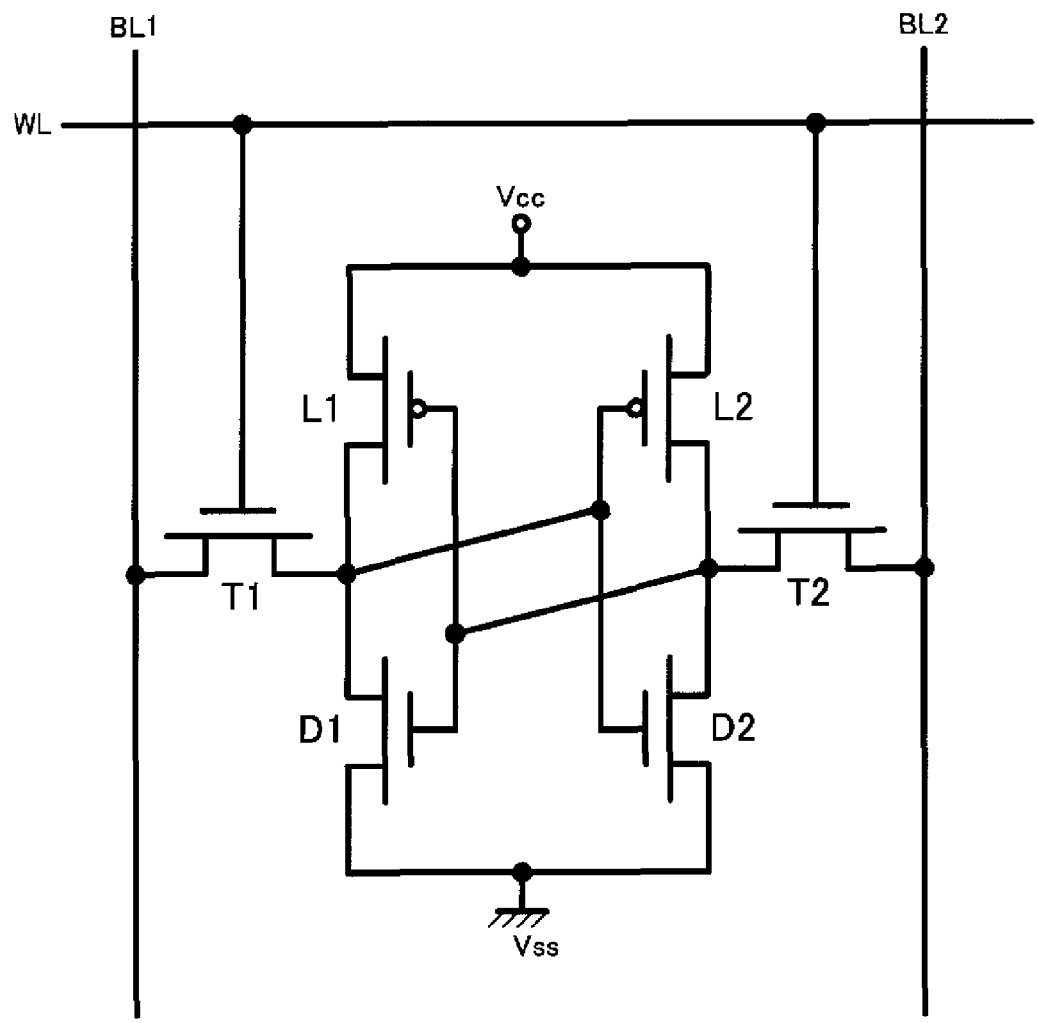
FIG. 15 is an equivalent circuit diagram of an SRAM unit cell.

As a result, a circuit as shown in FIG. 15 is realized.

When a cell configuration of the SRAM unit cell 50a as shown in FIG. 4 is used as a standard configuration, an SRAM unit cell 50 shown in FIG. 5 has the following configuration. That is, the transfer transistors T1 and T2 are configured obliquely in the counterclockwise direction in the drawing without changing an electrical connection relationship among constituents (see FIG. 2).

Therefore, sizes in the transfer transistor T1 and driver transistor D1 in the vertical direction in the drawing as well as sizes in the transfer transistor T2 and driver transistor D2 in the vertical direction in the drawing are reduced as compared with those in the standard configuration.

Further, the SRAM unit cell 50 shown in FIG. 5 has the following configuration. That is, accompanying such miniaturization of outside portions, a distance between the load transistors L1 and L2 in the central part is reduced as compared with that in the SRAM unit cell 50a shown in FIG. 4.

Specifically, sizes of the active regions 55 and 56 are appropriately changed to bring the gate electrode 51 and the contact electrode 59c closer to the gate electrode 52 side or to bring the gate electrode 52 and the contact electrode 59b closer to the gate electrode 51 side. Between the gate electrode 51 and the contact electrode 59b as well as between the gate electrode 52 and the contact electrode 59c, a space allowing such a configuration change to be performed is left even in the standard configuration.

Thus, the size reduction in the outside portion, namely, the size reduction in the transfer transistor T1 and driver transistor D1 in the vertical direction in the drawing as well as in the transfer transistor T2 and driver transistor D2 in the vertical direction in the drawing is performed. Further, a distance between the load transistors L1 and L2 is reduced such that the contact electrodes 59a, 59e and 59h as well as the contact electrodes 59d, 59g and 59j are configured on the cell boundary line and at the same time, the gate electrodes 51 and 52 are configured parallel to each other.

By adopting such a configuration, a size in the short-side direction (in the vertical direction in the drawing) of the SRAM unit cell 50 shown in FIG. 5, which is viewed as a cell having a planar rectangular shape, can be reduced as compared with that in the SRAM unit cell 50a shown in FIG. 4.

At this time, a size in the long-side direction (in the horizontal direction in the drawing) increases slightly. However, since the SRAM unit cell 50 has a long rectangular shape in the horizontal direction in the drawing, the amount of reduction in the cell area due to the size reduction in the short-side direction exceeds the amount of increase in the cell area due to the size increase in the long-side direction. As a result, reduction in the cell area can be realized.

Even in the case of thus configuring obliquely the transfer transistors T1 and T2, displacement in the contact electrodes 59g and 59h of the active regions 57 and 58 as well as in the contact electrodes 59k and 59l of the gate electrodes 53 and 54 is relatively small. Therefore, wirings connected to the contact electrodes in the upper layer may be configured according to oblique angles of the transfer transistors T1 and T2 while undergoing a parallel movement from positions in the case of not configuring the transistors T1 and T2 obliquely. This is also true for the first and second bit lines BL1 and BL2, and the word line WL. Accordingly, in configuring the SRAM unit cell 60 as shown in FIG. 5, a large design change is unnecessary for the wiring structure of the upper layer.

Next, a second application example will be described.

Figure 6:
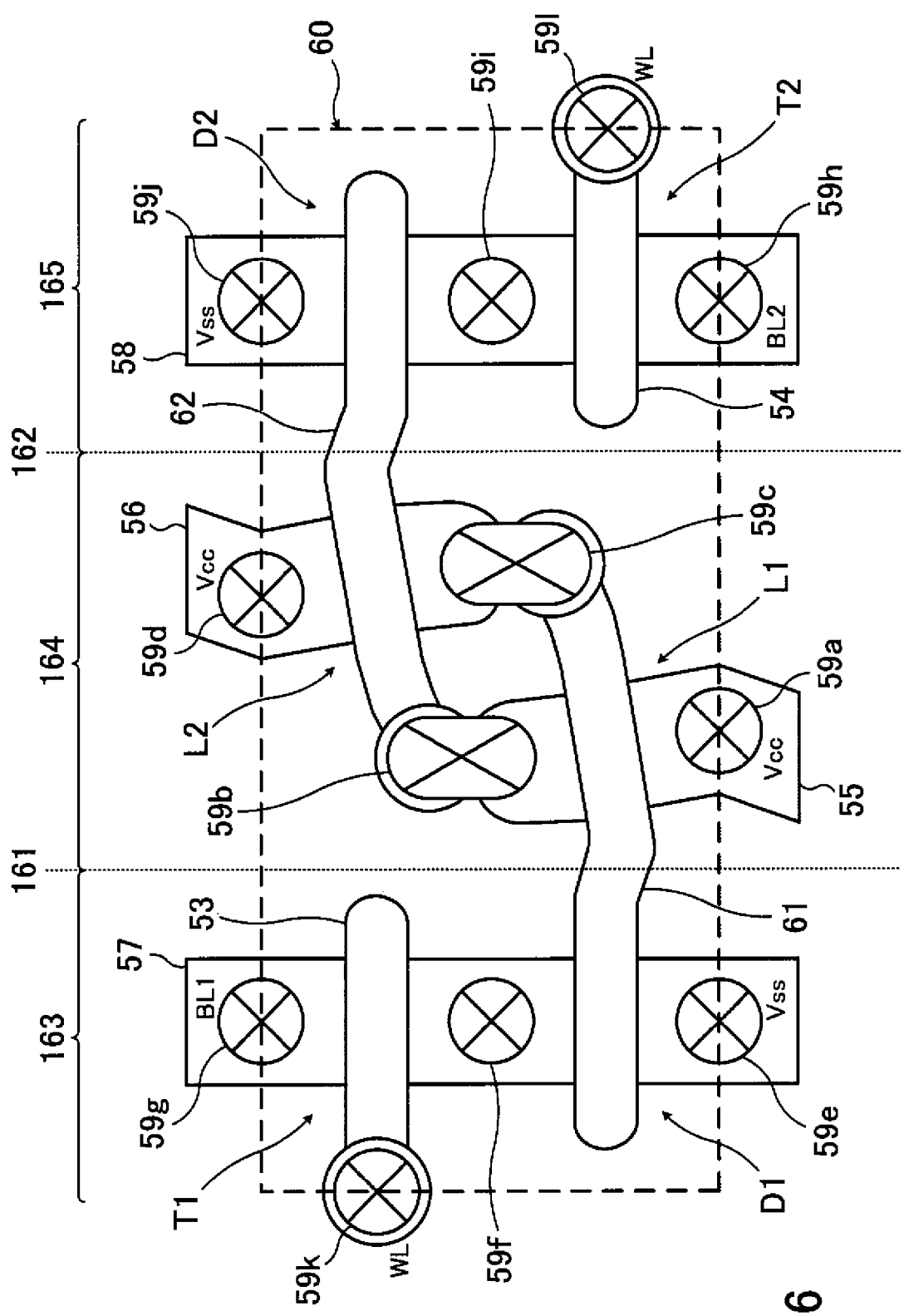
FIG. 6 is an essential-part schematic plan view of an SRAM unit cell of a second application example.

FIG. 6 is an essential-part schematic plan view of an SRAM unit cell of the second application example. In FIG. 6, the same elements as those shown in FIGS. 4 and 5 are indicated by the same reference numerals as in FIGS. 4 and 5 and the detailed description is omitted.

When a cell configuration of the SRAM unit cell 50a as shown in FIG. 4 is used as a standard configuration, an SRAM unit cell 60 shown in FIG. 6 has the following configuration. That is, the load transistors L1 and L2 are configured obliquely in the counterclockwise direction in the drawing without changing an electrical connection relationship among constituents. At this time, the gate electrodes 61 and 62 are formed in a shape corresponding to the configuration relationship between the driver transistor D1 and the obliquely configured load transistor L1 as well as between the driver transistor D2 and the obliquely configured load transistor L2, respectively. A distance between the load transistors L1 and L2 is set such that the contact electrodes 59a, 59e and 59h as well as the contact electrodes 59d, 59g and 59j are configured on the cell boundary line.

Further, the SRAM unit cell 60 shown in FIG. 6 has the following configuration. That is, the driver transistor D1 and the transfer transistor T1 as well as the driver transistor D2 and the transfer transistor T2 are configured closer to the load transistor L1 and L2 sides, respectively, than those of the standard configuration.

Thus, in the SRAM unit cell 60 shown in FIG. 6, the load transistors L1 and L2 in the central part are configured obliquely. By doing so, as compared with the case where the transistors L1 and L2 are not configured obliquely, new spaces can be formed with the outer driver transistor D1 and transfer transistor T1 as well as with the outer driver transistor D2 and transfer transistor T2.

Further, using the empty spaces, the driver transistors D1 and D2 as well as the transfer transistors T1 and T2 are configured. By doing so, the size in the horizontal direction in the drawing can be reduced as compared with that in the SRAM unit cell 50a shown in FIG. 4. As a result, the cell area can be reduced.

In configuring the SRAM unit cell 60 shown in FIG. 6, a large design change is unnecessary for the wiring structure of the upper layer.

Next, a third application example will be described.

Figure 7:
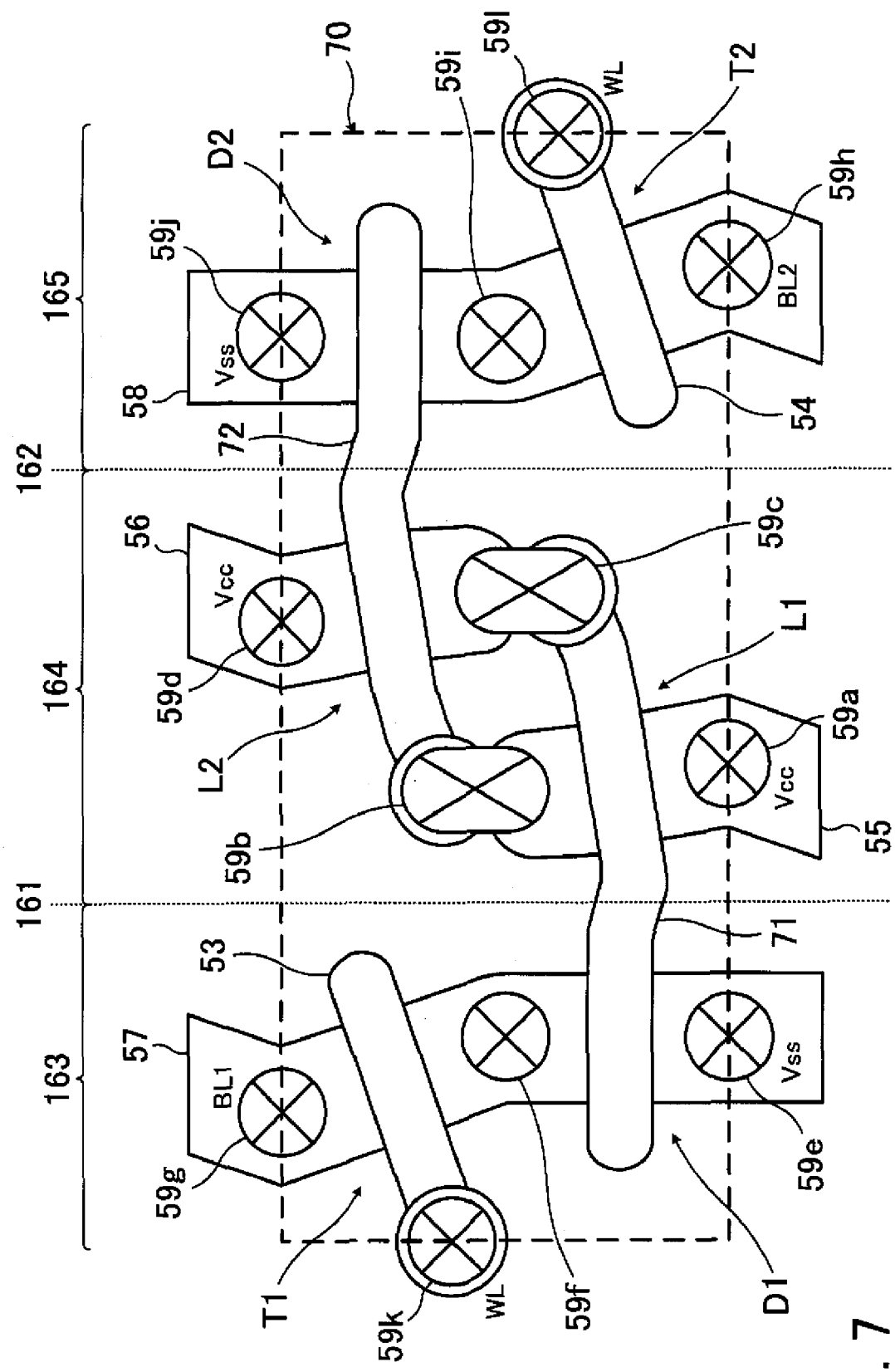
FIG. 7 is an essential-part schematic plan view of an SRAM unit cell of a third application example.

FIG. 7 is an essential-part schematic plan view of the SRAM unit cell of the third application example. In FIG. 7, the same elements as those shown in FIGS. 4 and 5 are indicated by the same reference numerals as in FIGS. 4 and 5 and the detailed description is omitted.

When a cell configuration of the SRAM unit cell 50a as shown in FIG. 4 is used as a standard configuration, an SRAM unit cell 70 shown in FIG. 7 has the following configuration. That is, without changing an electrical connection relationship among constituents, the transfer transistors T1 and T2 are configured obliquely in the counterclockwise direction in the drawing as well as the load transistors L1 and L2 are configured obliquely in the counterclockwise direction in the drawing. Further, using spaces formed by configuring obliquely the load transistors L1 and L2, the driver transistors D1 and D2 as well as the transfer transistors T1 and T2 are configured.

The gate electrodes 71 and 72 are formed in a shape corresponding to the configuration relationship between the driver transistor D1 and the obliquely configured load transistor L1 as well as between the driver transistor D2 and the obliquely configured load transistor L2, respectively. A distance between the load transistors L1 and L2 is set such that the contact electrodes 59a, 59e and 59h as well as the contact electrodes 59d, 59g and 59j are configured on the cell boundary line.

Thus, in the SRAM unit cell 70 shown in FIG. 7, the size reduction in the vertical direction in the drawing is realized by obliquely configuring the transfer transistors T1 and T2. At the same time, the size reduction in the horizontal direction in the drawing is realized by obliquely configuring the load transistors L1 and L2. As a result, the cell area is reduced.

In configuring the SRAM unit cell 70 shown in FIG. 7, a large design change is unnecessary for the wiring structure of the upper layer.

Next, a fourth application example will be described.

Figure 8:
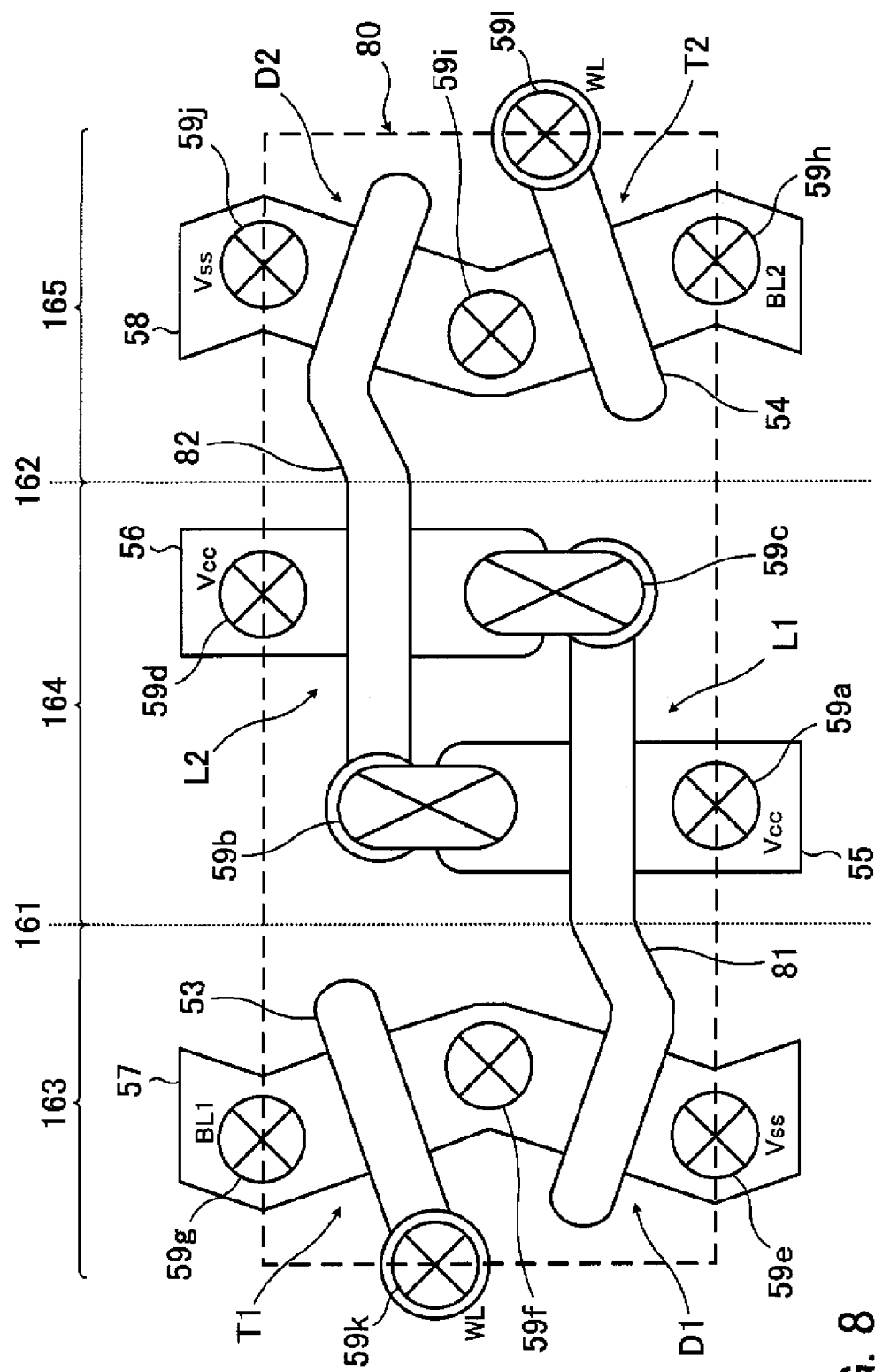
FIG. 8 is an essential-part schematic plan view of an SRAM unit cell of a fourth application example.

FIG. 8 is an essential-part schematic plan view of the SRAM unit cell of the fourth application example. In FIG. 8, the same elements as those shown in FIGS. 4 and 5 are indicated by the same reference numerals as in FIGS. 4 and 5 and the detailed description is omitted.

When a cell configuration of the SRAM unit cell 50a as shown in FIG. 4 is used as a standard configuration, an SRAM unit cell 80 shown in FIG. 8 has the following configuration. That is, without changing an electrical connection relationship among constituents, the transfer transistors T1 and T2 are configured obliquely in the counterclockwise direction in the drawing as well as the driver transistors D1 and D2 are configured obliquely in the clockwise direction in the drawing (see FIG. 3).

The gate electrodes 81 and 82 are formed in a shape corresponding to the configuration relationship between the obliquely configured driver transistor D1 and the load transistor L1 as well as between the obliquely configured driver transistor D2 and the load transistor L2, respectively. Further, the SRAM unit cell 80 shown in FIG. 8 has the following configuration. That is, as compared with the case in the SRAM unit cell 50*a* shown in FIG. 4, a distance between the load transistors L1 and L2 is reduced such that the contact electrodes 59*a*, 59*e* and 59*h* as well as the contact electrodes 59*d*, 59*g* and 59*j* are configured on the cell boundary line.

Thus, in the SRAM unit cell 80 shown in FIG. 8, the transfer transistors T1 and T2 and the driver transistors D1 and D2 are each configured obliquely in the predetermined direction and the distance between the load transistors L1 and L2 is reduced, whereby the size reduction in the vertical direction in the drawing is realized. Therefore, even if a size in the long-side direction of the rectangular SRAM unit cell 80 slightly increases, a size in the short-side direction thereof is reduced. As a result, the cell area can be effectively reduced.

In configuring the SRAM unit cell 80 shown in FIG. 8, a large design change is unnecessary for the wiring structure of the upper layer.

Next, a fifth application example will be described.

Figure 9:
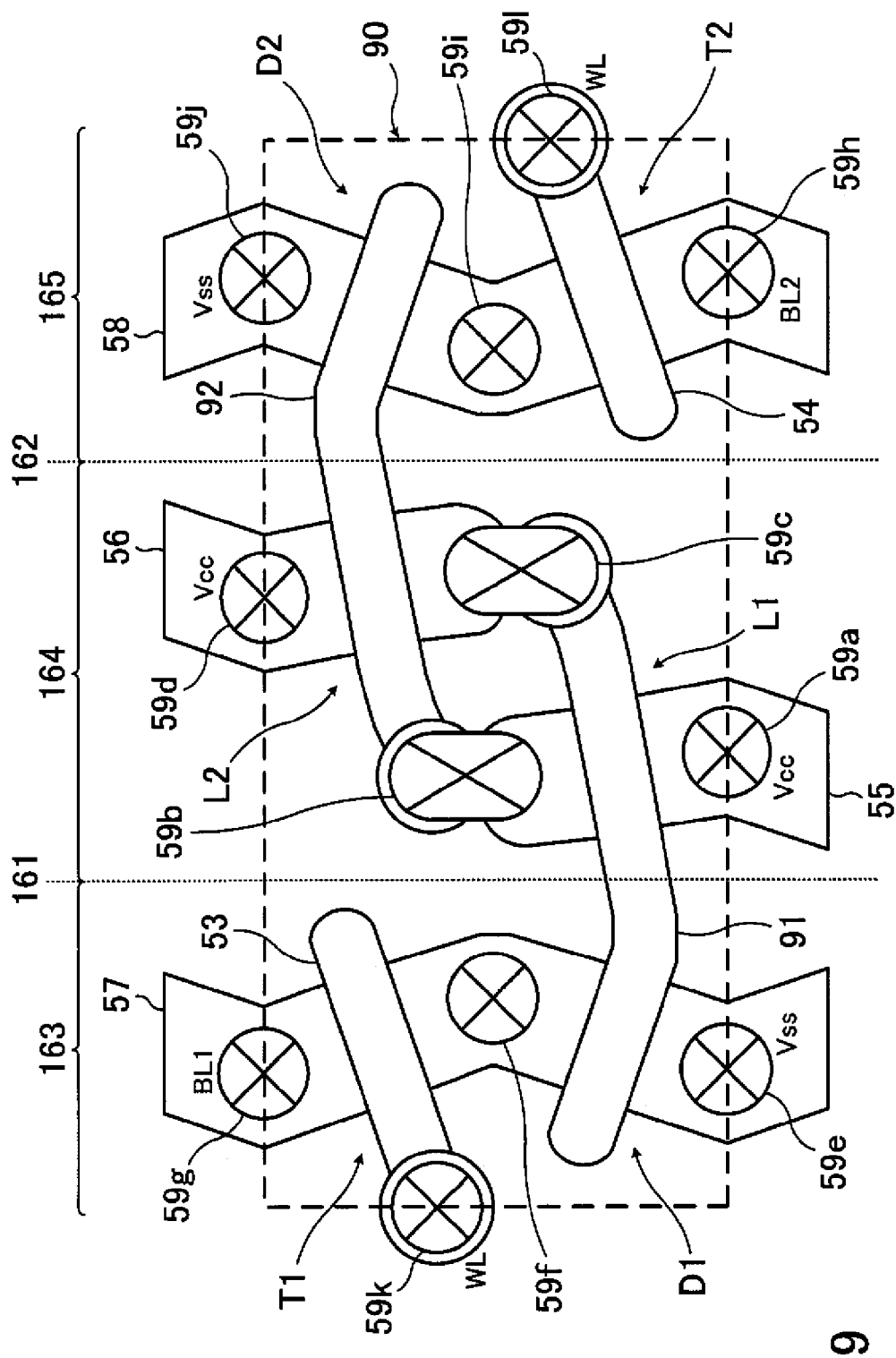
FIG. 9 is an essential-part schematic plan view of an SRAM unit cell of a fifth application example.

FIG. 9 is an essential-part schematic plan view of an SRAM unit cell of the fifth application example. In FIG. 9, the same elements as those shown in FIGS. 4 and 5 are indicated by the same reference numerals as in FIGS. 4 and 5 and the detailed description is omitted.

When a cell configuration of the SRAM unit cell 50*a* as shown in FIG. 4 is used as a standard configuration, an SRAM unit cell 90 shown in FIG. 9 has the following configuration. That is, without changing an electrical connection relationship among constituents, the transfer transistors T1 and T2 are configured obliquely in the counterclockwise direction in the drawing, the driver transistors D1 and D2 are configured obliquely in the clockwise direction in the drawing and at the same time, the load transistors L1 and L2 are configured obliquely in the counterclockwise direction in the drawing. Further, using spaces formed by obliquely configuring the load transistors L1 and L2, the driver transistors D1 and D2 as well as the transfer transistors T1 and T2 are configured.

The gate electrodes 91 and 92 are formed in a shape corresponding to the configuration relationship between the obliquely configured driver transistor D1 and load transistor L1 as well as between the obliquely configured driver transistor D2 and load transistor L2, respectively. A distance between the load transistors L1 and L2 is set such that the contact electrodes 59*a*, 59*e* and 59*h* as well as the contact electrodes 59*d*, 59*g* and 59*j* are configured on the cell boundary line.

Thus, in the SRAM unit cell 90 shown in FIG. 9, the size reduction in the vertical direction in the drawing is realized by obliquely configuring the transfer transistors T1 and T2 and the driver transistors D1 and D2. At the same time, the size reduction in the horizontal direction in the drawing is realized by obliquely configuring the load transistors L1 and L2. As a result, the cell area is reduced.

In the case of the SRAM unit cell 90 shown in FIG. 9, the cell area reduction of at least about 5% can be realized as compared with that in the SRAM unit cell 50*a* shown in FIG. 4.

In configuring the SRAM unit cell 90 shown in FIG. 9, a large design change is unnecessary for the wiring structure of the upper layer.

Next, a sixth application example will be described.

Figure 10:
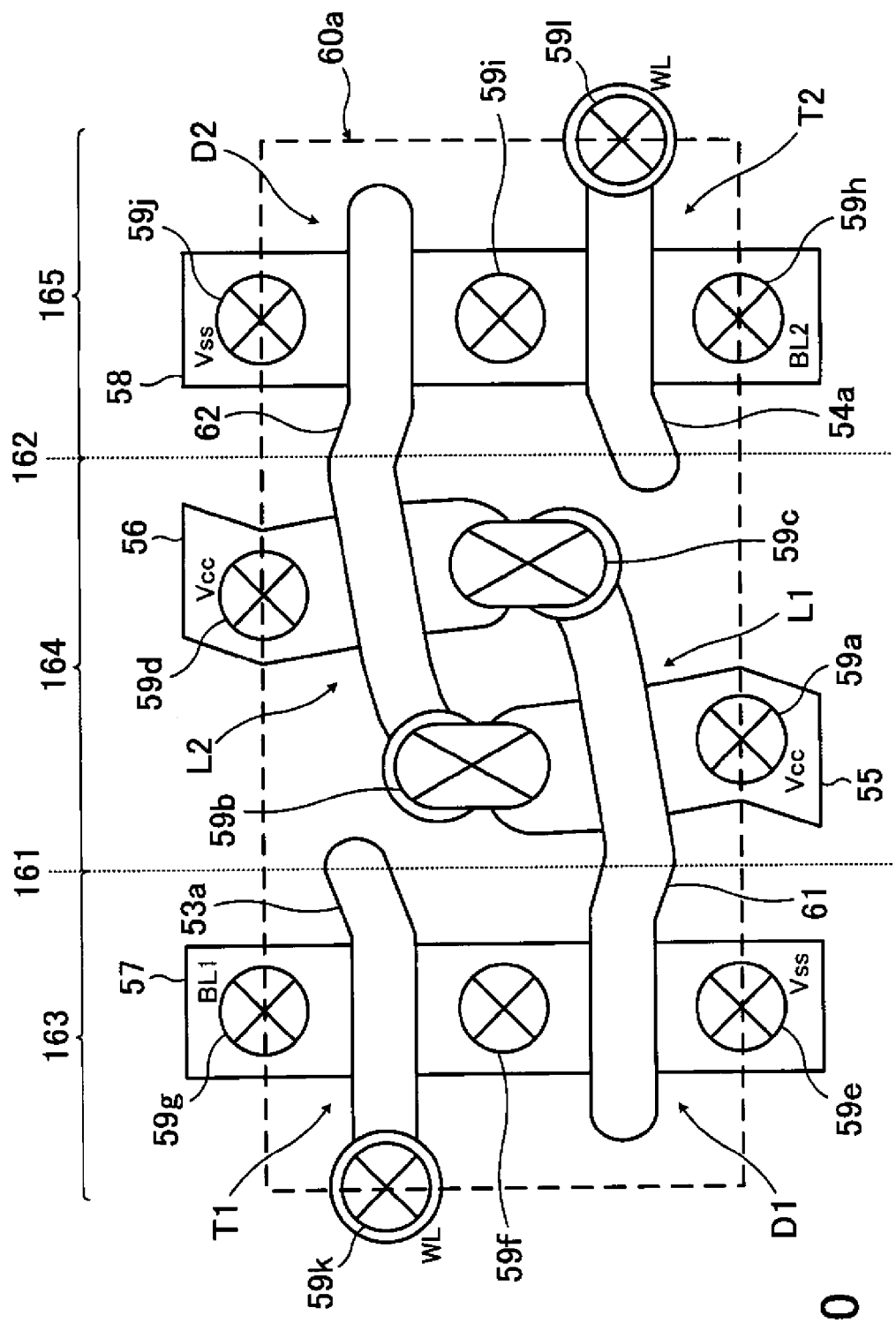
FIG. 10 is an essential-part schematic plan view of an SRAM unit cell of a sixth application example.

FIG. 10 is an essential-part schematic plan view of an SRAM unit cell of the sixth application example. In FIG. 10, the same elements as those shown in FIG. 6 are indicated by the same reference numerals as in FIG. 6 and the detailed description is omitted.

An SRAM unit cell 60*a* shown in FIG. 10 has the following configuration. That is, ends of the gate electrodes 53*a* and 54*a* of the transfer transistors T1 and T2 are configured obliquely in the direction apart from the contact electrodes 59*b* and 59*c*, respectively. In this point, the SRAM unit cell 60*a* differs from the SRAM unit cell 60 of the second application example shown in FIG. 6.

According to the above-described SRAM unit cell 60*a*, the driver transistor D1 and the transfer transistor T1 as well as the driver transistor D2 and the transfer transistor T2 are configured closer to the load transistor L1 and L2 sides while securing a distance margin between the end of the gate electrode 53*a* and the contact electrode 59*b* as well as between the end of the gate electrode 54*a* and the contact electrode 59*c*, respectively.

Next, a seventh application example will be described.

Figure 11:
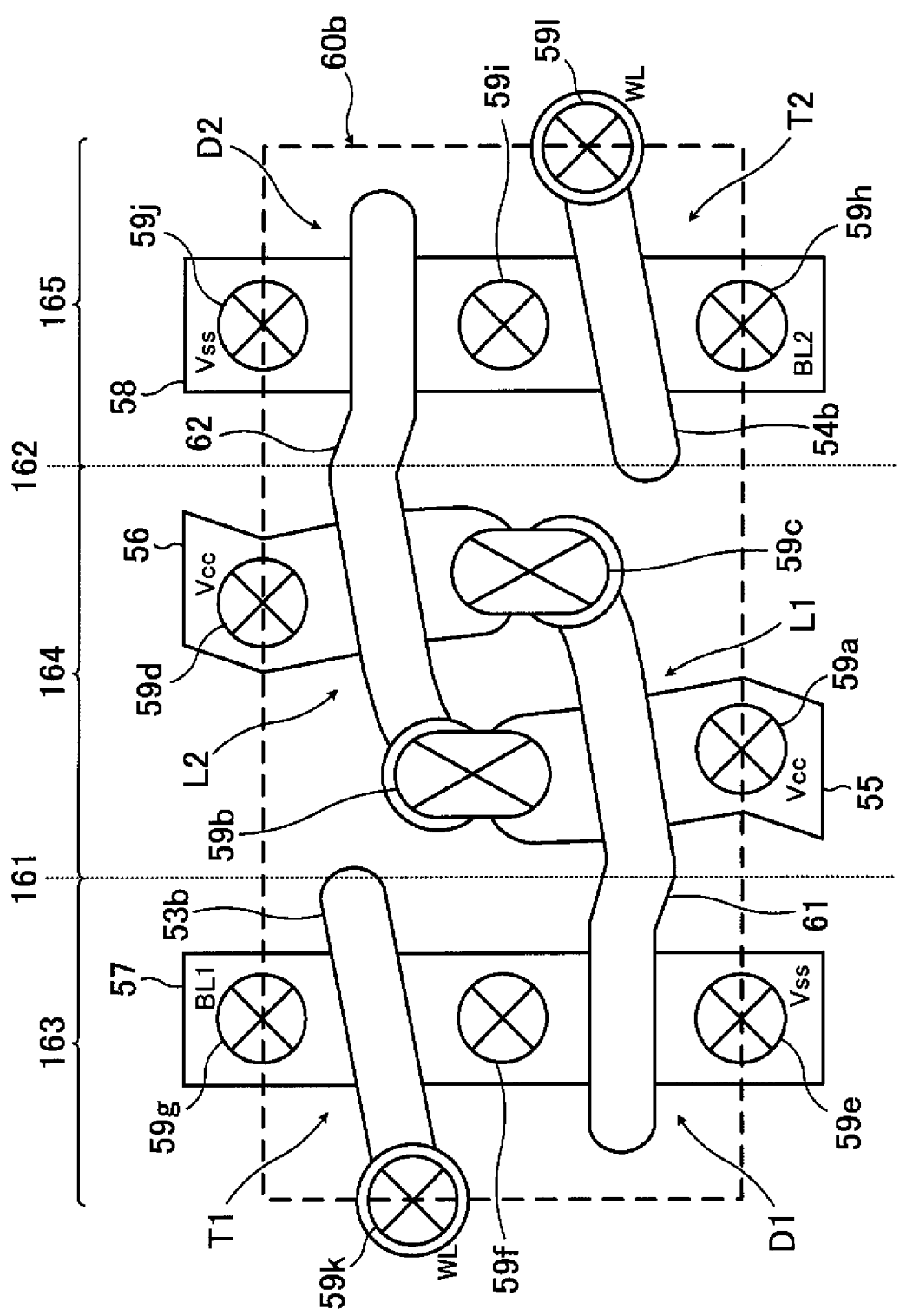
FIG. 11 is an essential-part schematic plan view of an SRAM unit cell of a seventh application example.
Figure 12:
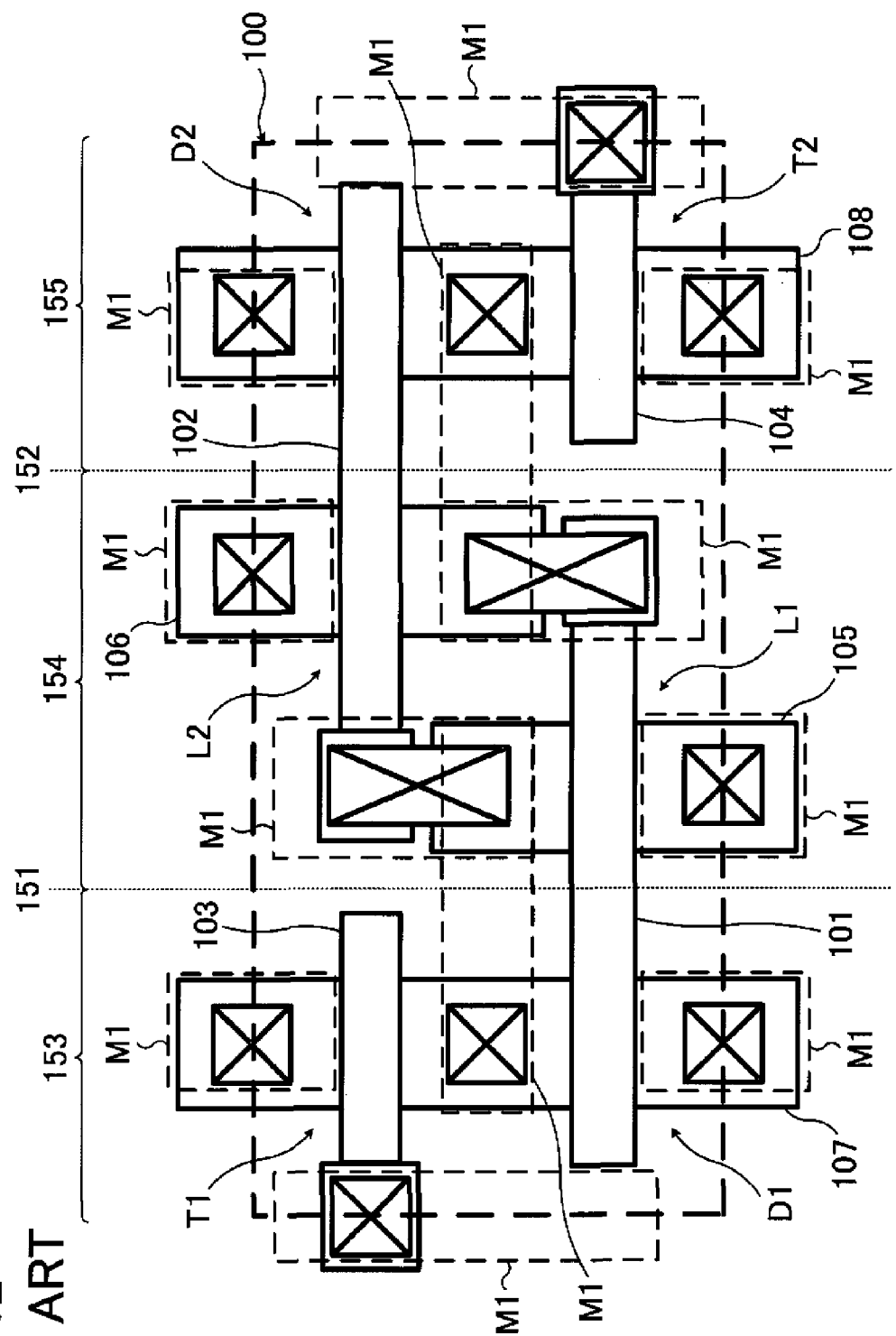
FIG. 12 is an essential-part schematic plan view between a bulk layer and a first wiring layer of a conventional SRAM unit cell.
Figure 13:
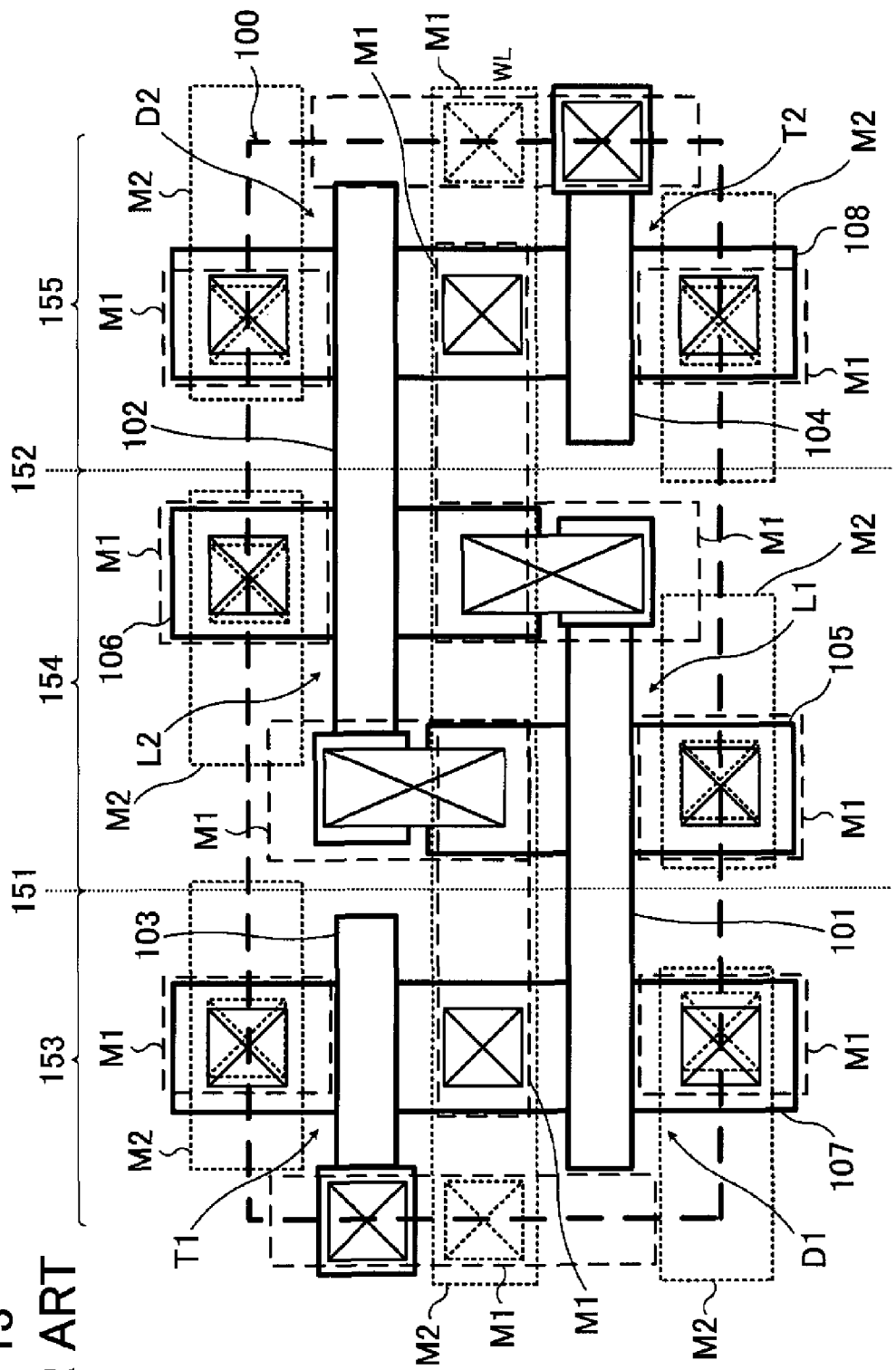
FIG. 13 is an essential-part schematic plan view between a bulk layer and a second wiring layer of a conventional SRAM unit cell.
Figure 14:
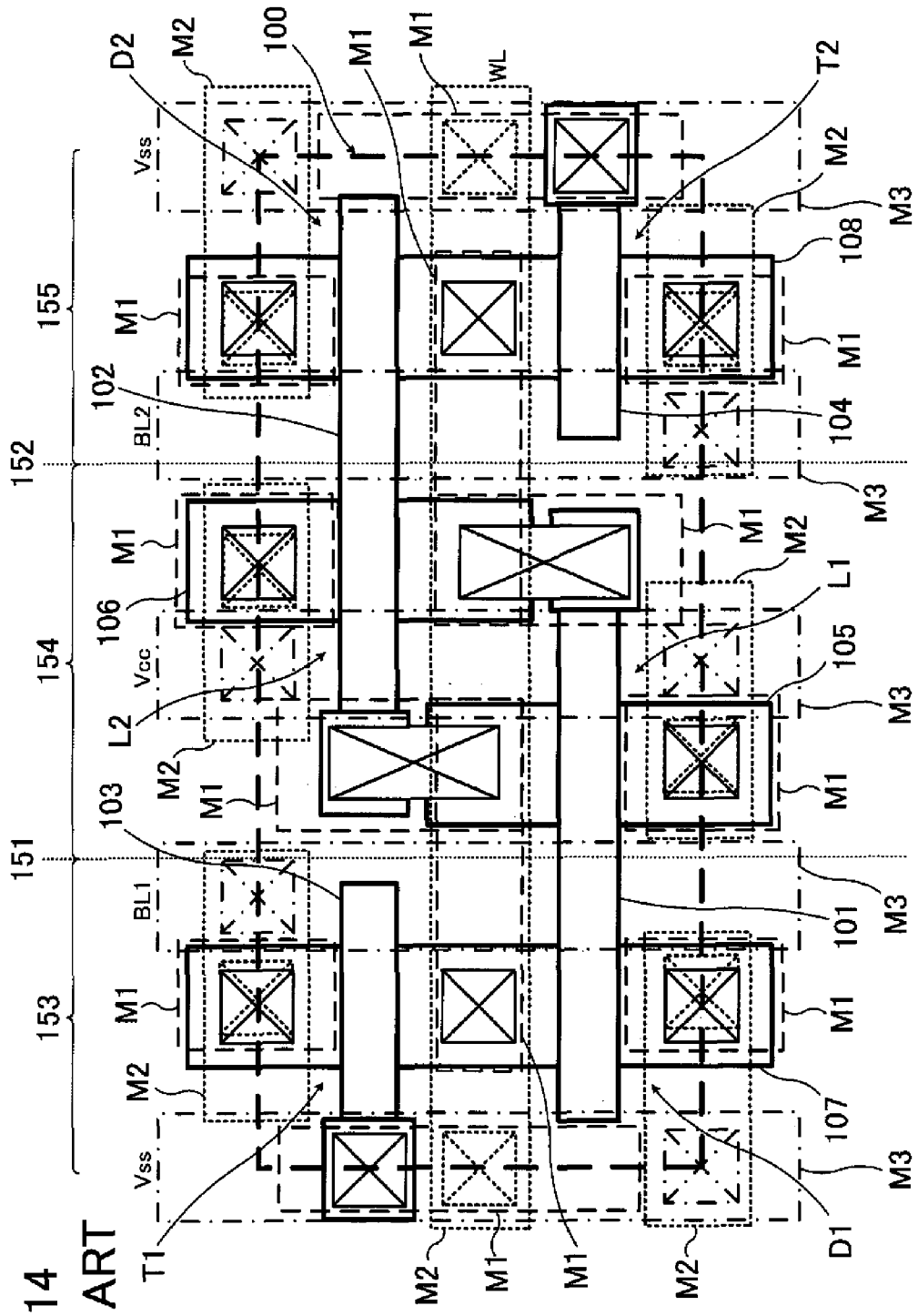
FIG. 14 is an essential-part schematic plan view between a bulk layer and a third wiring layer of a conventional SRAM unit cell.

FIG. 11 is an essential-part schematic plan view of an SRAM unit cell of the seventh application example. In FIG. 11, the same elements as those shown in FIG. 6 are indicated by the same reference numerals as in FIG. 6 and the detailed description is omitted.

An SRAM unit cell 60*b* shown in FIG. 11 has the following configuration. That is, all of the gate electrodes 53*b* and 54*b* of the transfer transistors T1 and T2 are configured obliquely in the direction apart from the contact electrodes 59*b* and 59*c*, respectively. In this point, the SRAM unit cell 60*b* differs from the SRAM unit cell 60 of the second application example shown in FIG. 6.

According to the above-described SRAM unit cell 60*b*, in the same manner as in the sixth application example, the driver transistor D1 and the transfer transistor T1 as well as the driver transistor D2 and the transfer transistor T2 are configured closer to the load transistor L1 and L2 sides while securing a distance margin between the end of the gate electrode 53*a* and the contact electrode 59*b* as well as between the end of the gate electrode 54*a* and the contact electrode 59*c*, respectively.

Further, in comparison with the gate electrodes 53*a* and 54*a* of the sixth application example, even if displacement in the horizontal direction in the drawing occurs on the gate electrodes 53*b* and 54*b*, the configuration relationship among constituents in the transfer transistors T1 and T2 is not greatly changed. Therefore, a constant characteristic can be stably obtained.

As described above, using as a standard configuration the parallel-type unit cell having each pair of the load transistors, the driver transistors and the transfer transistors, at least any one of the pairs of the transistors is configured obliquely from the standard configuration. In the pair of the obliquely configured transistors, a constant distance, for example, a minimum rule distance in design and in processing is secured between the gate electrode and the contact electrode formed in the active region. As a result, reduction in the SRAM unit cell can be realized without impairing reliability. Therefore, a high-reliable and small SRAM can be realized. In addition, an SRAM suppressed in size and improved in a degree of integration can be realized.

In the present invention, using as a standard configuration the parallel-type unit cell having each pair of the load transistors, the driver transistors and the transfer transistors, at least any one of the pairs of the transistors is configured obliquely from the standard configuration. As a result, reduction in the SRAM unit cell can be realized without impairing reliability. Therefore, a small semiconductor memory device can be realized or a semiconductor memory device suppressed in size and improved in a degree of integration can be realized.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A semiconductor memory device, comprising:
a first p-type active region;
a second p-type active region formed in a first direction a first distance away from the first p-type active region;
a first n-type active region formed a second distance away from the first p-type active region between the first p-type active region and the second p-type active region;
a second n-type active region formed a third distance away from the first p-type active region between the first p-type active region and the second p-type active region, the third distance being longer than the second distance;
a first n-type transistor having a first gate electrode formed on the first p-type active region;
a third n-type transistor having a third gate electrode formed on the first p-type active region;
a second n-type transistor having a second gate electrode formed on the second p-type active region;
a fourth n-type transistor having a fourth gate electrode formed on the second p-type active region;
a first p-type transistor having a fifth gate electrode formed on the first n-type active region;
a second p-type transistor having a sixth gate electrode formed on the second n-type active region;
a first contact connected to the fifth gate electrode of the first p-type transistor;
a second contact connected to a second drain electrode of the second p-type transistor;
a third contact connected to the sixth gate electrode of the second p-type transistor;
a fourth contact connected to the first drain electrode of the first p-type transistor;
a fifth contact connected to a third drain electrode of the first n-type transistor; and
a sixth contact connected to a fourth drain electrode of the second n-type transistor;
wherein:
the first contact, the second contact and the sixth contact are electrically connected to each other,
the third contact, the fourth contact and the fifth contact are electrically connected to each other,
the third gate electrode and the fifth gate electrode are electrically connected to each other,
the fourth gate electrode and the sixth gate electrode are electrically connected to each other,
the first contact is arranged between the second p-type active region and the first n-type active region,
the third contact is arranged between the first p-type active region and the second n-type active region,
the first gate electrode is arranged in a second direction perpendicular to the first direction with respect to the third gate electrode, and
the fourth gate electrode is arranged in the second direction with respect to the second gate electrode, and
wherein:
the fifth gate electrode and the sixth gate electrode extend in the first direction, and a pair of the first gate electrode and the second gate electrode, a pair of the third gate electrode and the fourth gate electrode, or a combination thereof is configured to extend obliquely with respect to the first direction, or
the first gate electrode and the second gate electrode extend in the first direction, and a pair of the third gate electrode and the fourth gate electrode, a pair of the fifth gate electrode and the sixth gate electrode, or a combination thereof is configured to extend obliquely with respect to the first direction, or
the third gate electrode and the fourth gate electrode extend in the first direction, and a pair of the first gate electrode and the second gate electrode, a pair of the fifth gate electrode and the sixth gate electrode, or a combination thereof is configured to extend obliquely with respect to the first direction.

2. The semiconductor memory device according to claim 1, wherein the pair of the first gate electrode and the second gate electrode, the pair of third gate electrode and the fourth gate electrode, or the pair of the fifth gate electrode and the sixth gate electrode are configured to extend obliquely in a same rotation direction with respect to the first direction.

3. The semiconductor memory device according to claim 1, wherein the pair of the first gate electrode and the second gate electrode, the pair of the third gate electrode and the fourth gate electrode, or the pair of the fifth gate electrode and the sixth gate electrode are configured to extend obliquely at 45° or less with respect to the first direction.

4. The semiconductor memory device according to claim 1, wherein, in a case where the first and second gate electrodes extend in the first direction and the fifth and sixth gate electrodes extend obliquely with respect to the first direction, ends of the first and second gate electrodes are configured obliquely in a direction apart from the first and second p-type transistors, respectively.

5. The semiconductor memory device according to claim 1, wherein:
each of the first and second p-type transistors has a source electrically connected to a power supply line;
each of the third and fourth n-type transistors has a source electrically connected to a grounding line;
the first and second n-type transistors have sources electrically connected to a first and second bit lines, respectively; and
the first and second gate electrodes are electrically connected to a common word line.

* * * * *